(12) United States Patent
Matsushita et al.

(10) Patent No.: US 6,330,705 B1
(45) Date of Patent: Dec. 11, 2001

(54) METHOD AND SYSTEM FOR REMODELING, DESIGNING, AND EDITING A PRINTED WIRING BOARD USING A COMPUTER AIDED DESIGN SYSTEM

(75) Inventors: Hideharu Matsushita, Kawasaki; Shinichi Taoka; Chikou Kobayashi, both of Oyama, all of (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/173,522

(22) Filed: Oct. 15, 1998

(30) Foreign Application Priority Data

Jan. 29, 1998 (JP) .................................................. 10-016869

(51) Int. Cl.[7] .................................................. G06F 17/50
(52) U.S. Cl. .................................................. 716/11
(58) Field of Search ................... 716/15, 6, 1, 2, 716/12, 11

(56) References Cited

U.S. PATENT DOCUMENTS

| 4,571,072 | * | 2/1986 | Bourbeau, Jr. et al. | 355/79 |
|---|---|---|---|---|
| 4,768,154 | * | 8/1988 | Sliwkowski et al. | 364/468 |
| 5,119,434 | * | 6/1992 | Bishop et al. | 382/147 |
| 5,315,535 | * | 5/1994 | Kikuchi et al. | 364/490 |
| 5,473,547 | * | 12/1995 | Muroga | 364/489 |
| 5,812,413 | * | 9/1998 | Matsushita | 716/15 |
| 5,889,677 | * | 3/1999 | Yasuda et al. | 716/6 |

FOREIGN PATENT DOCUMENTS

| 3-262080 | 11/1991 | (JP) . |
|---|---|---|
| 4-21074 | 1/1992 | (JP) . |
| 5-266140 | 10/1993 | (JP) . |

* cited by examiner

*Primary Examiner*—Matthew Smith
*Assistant Examiner*—Leigh Marie Garbowski
(74) *Attorney, Agent, or Firm*—Rosenman & Colin LLP

(57) ABSTRACT

Remodeling, designing and editing method and system for a printed wiring board which makes it possible to reduce steps for remodeling operation and improving a quality of remodeled d a according to effectiveness of manual editing is provided. The method and system comprises the steps for comparing connection pattern data of the previously provided printed wiring board with that of the latest circuit, displaying an editable section, which is different from that of the latest circuit, detected on the comparison, and inputting an instruction of disconnection or wiring to the editable section displayed on the displaying step.

11 Claims, 16 Drawing Sheets

```
1. connection error (A: short)              :20
2. connection error (B: shortage of connections) :10
3. connection error (C: exclusive connections)  : 5         S1
4. number of components disconnected        : 1
5. number of components wired               : 1
```

↓ Select the first line

```
Net No: 1      error (A, B)
Net No: 10     error (A)                                    S2
. . . . . . . . . . . . . . . . . . . .
```

↓ Select Net No: 1

S3

———— Error

- - - - - - shortage of connections

FIG. 4

· ECL error listing displaying panel

| 7. number of ECL errors | S11 |

↓ Selecting a line of 7

| Net No: 1  error (ECL2) · · · · · · · · · · | S12 |

↓

S13
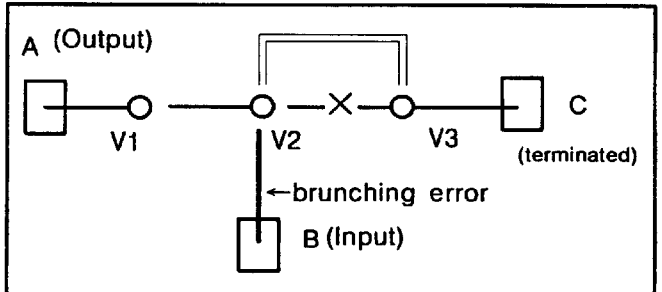
←brunching error

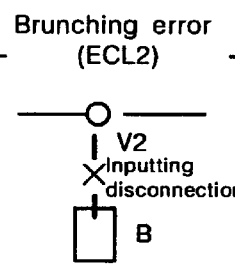
Brunching error (ECL2)
S14

<brunching length error>
(Inputting a disconnection between B and V2)

↓ S15
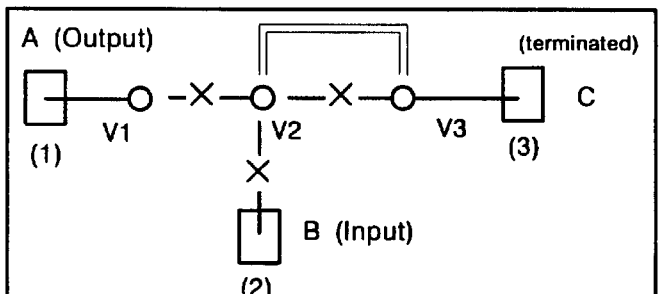

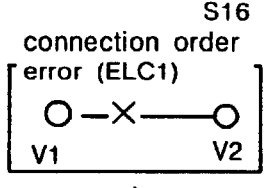
S16 connection order error (ELC1)

↓ S17
connection order error (ELC1)
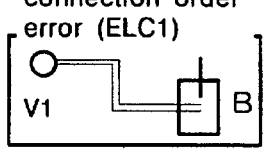

<connection order error>
(inputting wires in numeric order)

↓ S19
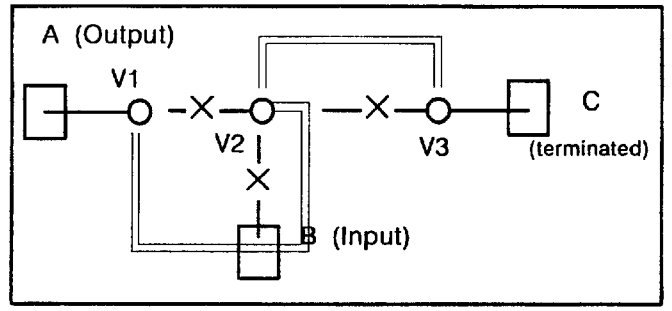

↓ S18
connection order error (ELC1)
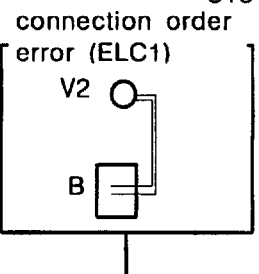

FIG. 8A

Status on printed wiring board (8 layers:SSESSVSS)

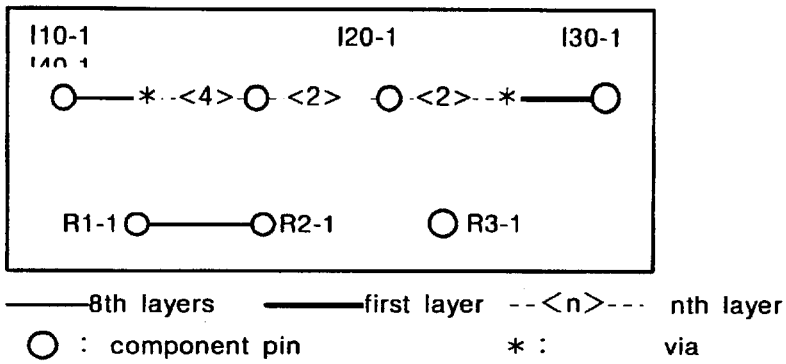

——— 8th layers ——— first layer --<n>--- nth layer
○ : component pin   * : via

FIG. 8B

Displaying error list (per an operation purpose)

| a number of short errors :n |
| a number of exclusive connections :m |
| a number of shortage of connections:i |
| details |
| netno ( 1) connection error(A ) |
| netno ( 2) connection error(A, B) |
| netno ( 3) connection error(A, B) |

A: short
B: shortage(non connected)
C: exclusive connection

FIG. 8C

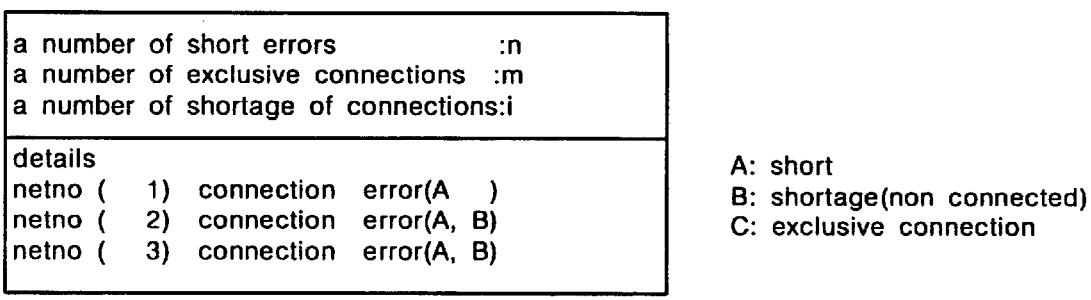

FIG. 8D

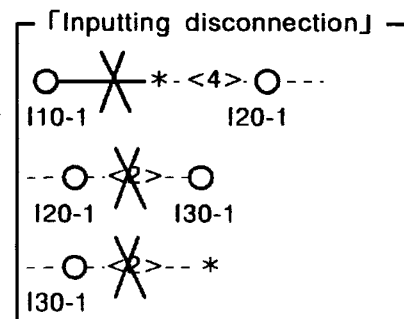

FIG. 8F to FIG. 8E

FIG. 8E   from FIG. 8D
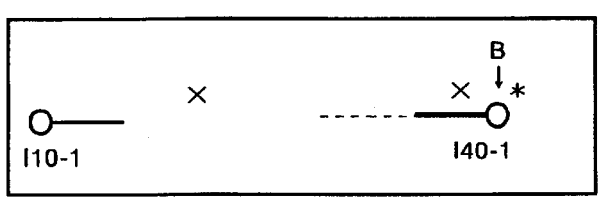
↓ for editing net 2
FIG. 8F
「inputting jumper-wiring」
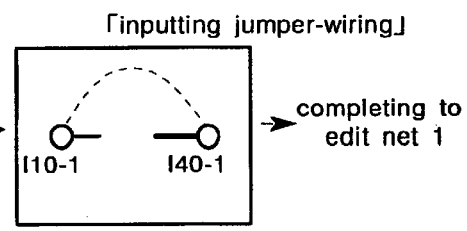
→ completing to edit net 1
FIG. 8G
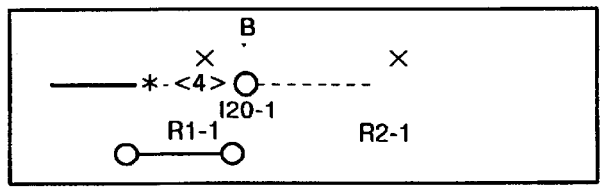
↓ enabling to similarly process with respect to net 3
FIG. 8H
「inputting jumper-wiring」
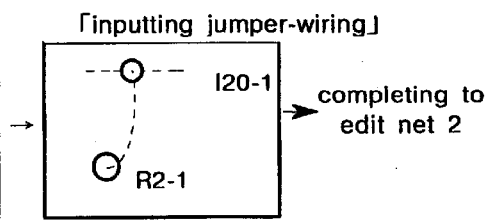
→ completing to edit net 2

Phase 1

Phase 2

Phase 3

Phase 4

Previous version: A-B-C, X-Y-Z

New version: A-B, X-Y-Z

METHOD AND SYSTEM FOR REMODELING, DESIGNING, AND EDITING A PRINTED WIRING BOARD USING A COMPUTER AIDED DESIGN SYSTEM

BACKGROUND OF THE INVENTION

1. Field of the Invention

The present invention relates to remodeling, designing and editing method and system for a printed wiring board in which the latest circuit data can be reflected by performing a wire disconnection or wiring by the use of jumper (hereinafter it is called jumper-wiring) on a previously provided printed wiring board to modify its circuit design, packaged on one component of a CAD system, i.e., a computer aided design system.

2. Description of the Related Art

It has been extended to design for packaging a printed wiring board by employing a CAD system, i.e., computer aided design system, on one component.

In addition, there is a case where alternation of a packaged board is required on the previously provided printed circuit board due to modification or mis-designing of the circuit design. In this case, a remodeling, designing and editing method and system for a printed wiring board has been employed. In this method and system, the packaged CAD is used to edit and update the circuit design data.

On the other hand, there is a demand to easily execute actual editing operations at high speed when modifying the circuits on the previously provided printed wiring board with respect to a multi-layered or high-density, printed wiring board or a high-speeded circuit.

FIG. 10 shows one example of the conventional remodeling, designing and editing method and system for a printed wiring board. Pattern data, such as a via-hole VIA (hereinafter, it is called as a via for simplicity), which is a circuit pattern when creating a printed wiring board on the data base 1, data of the latest circuit on one printed wiring board to which altered sections are supplied, and remodeling data, such as data of disconnection or jumper-wiring when the alternation is executed by wiring disconnection or jumper-wiring, are stored in a database 1.

Additionally, the system of FIG. 10 comprises an editor 2 for remodeling, designing, and editing a printed wiring board having a display device. A controller in the editor 2 executes an automatic remodeling program 3 to activate an editing and checking controller 4. Then, the display controller 5 controls to display the result on the display device.

A remodeling, designing and editing method on the conventional system will be now explained.

FIG. 11 is a structural example of layers on a multi-layered printed wiring board. In this example, the board includes eight layers L1 to L8. The third layer L3 is an electric source, and the sixth layer L6 is an earth layer, both of which surfaces are conductive. The other layers are signal layers. The first layer L1 is for a component plane, and the sixth layer is for a soldering plane.

In this example, when the circuit is modified by disconnecting a wire, it is possible to respectively disconnect the first and second layers L1 and L2 from the component plane side, and the eighth and seventh layers L8 and L7 from the soldering plane side by radiating a laser beam. Since the fourth and fifth layers L4 and L5 may be through the conductive layers L3 and L6, it is impossible to disconnect these layers L4 and L5 even by radiating the laser beam.

A previously designed circuit pattern, as shown in FIG. 12, in the structure for a multi-layered printed wiring board will be now considered. That is, the circuit of FIG. 12 has a connection pattern of A-B-C-D. V1 and V2 are vias of the printed wiring board. In FIG. 12, L1, L2, L5, L8 are connections of the corresponding signal layers. Therefore, the circuit pattern of FIG. 12 forms a packaging connection structure shown in FIG. 13.

The connection pattern A-B-C-D of the multi-layered printed wiring board is modified to A-B-D as data of the latest connection pattern. Therefore, the patterns A-B-C-D and A-B-C are respectively stored as the previously provided pattern data and data of the latest connection pattern in the database 1.

The editing and checking controller 4 compares these patterns. The editor 2 displays the result, such as a circuit pattern shown in FIG. 12, under the control of the display controller 5. In this example, a part of the pattern of FIG. 12 can be enlarged and displayed by a designer's instruction from a mouse.

In FIG. 12, the different point between the previously provided connection pattern and the latest connection pattern is a connection between a via V2 and C. This difference is called an error, hereinafter. Accordingly, the error between the via V2 and C is emphasized by displaying a wire L5 by a bold line, or displaying it with a specified color, for example.

Accordingly, the designer detects the error-emphasized section with his own eyes and inputs a disconnecting instruction on the editor 2. Then, the designer should consider reducing the number of disconnecting instructions.

In this example, the editing and checking controller 4 can edit two layers, concurrently, in order to avoid from complication of editing. Therefore, a designer should consider a disconnection processing between V2 and C belonging to the error-displayed section for editing L1 and L8 layers in order to reduce the number of the disconnecting instructions at first. However, a connection between V2 and C is belonging to the L5 layer, and this connection can not be edited. Therefore, L1 and L5 layers are used for editing. However, the L5 layer, to which the connection between V2 and C is belonging, can not be disconnected as explained above.

Accordingly, the editing and checking controller 4 informs the disability of disconnection to the designer. Therefore, the designer moves the enlarged and displayed section by a mouse to obtain a section where an error is not emphasized to be edited. The designer sees the disconnected section line and selects L2 and L8 layers to be edited. Then, the designer instructs a disconnection between V2 and V1, and further instructs a disconnection between V2 and D.

After that, the designer instructs wiring between V1 and D, now shown in the diagram. Thereby, the pattern is modified to a connection pattern of A-B-D.

The database 1 stores disconnection data between V2 and V1 and jumper-wiring data between V1 and D as remodeling data.

Further, FIGS. 14A, 14B and 14C are explanatory diagrams for editing when remodeling a circuit pattern by adding, deleting or moving components in the system of FIG. 10. In FIG. 14A, components I10 and I20 are provided on a previously designed printed wiring board. A display sample of "STEP 1" is displayed on the editor 2. Then, a designer instructs to delete the component I10.

As a result, an image of the component I10 is not displayed, and only lands are displayed, as shown in a display sample of STEP 2, under the control of the display controller 5.

Additionally, FIG. 14B shows editing processing when a component I30 is newly added to an idle space of the printed wiring board on the display example STEP 1. The board on the STEP 2 shows an example where the designer instructs to arrange the component I30 on a position of a space I. The board of the STEP 3 shows an example where the designer instructs to add the component I30 on a position of the previously provided component R10.

In this case, if there is no land on the position where the designer instructs to add the new component, i.e., STEP 2 of FIG. 14B, this circuit cannot be remodeled, and therefore, this instruction is refused by the editing and checking controller 4. Further, the component R10 is arranged on a position where the designer instructs to add the new component. In other words, different components are overlapped and located on the same land on STEP 3 of FIG. 14B. Similarly to the above-described case, the editing and checking controller 4 refuses this instruction.

Further, if a designer instructs to move the component I10, the land on the original position can not be displayed after moving the component, as shown in STEP 2 of FIG. 4C.

FIG. 15 is a diagram for explaining a problem that automatic wiring is indistinguishable from manual remodeling on the system of FIG. 10. That is, connection patterns of the previously designed printed wiring board are A-B-C and X-Y-Z, and only the pattern A-B-C is modified to a connection pattern between A and B in FIG. 5. Then, if a connection pattern between X and Y is disconnected by mistake, the editing and checking controller 4 generates jumper-wiring data to automatically recovery the disconnection.

As described above, in remodeling, designing and editing method for a printed wiring board on the conventional system of FIG. 10, as explained in accompanying with FIGS. 11 to 13, a designer should check the error-displayed pattern with his own eyes, confirm the contents of the error, and judge which section is shorted or in which section connections lack. Additionally, the concurrently editable layer is limited to two. Therefore, performance of editing operations becomes lower, and therefore, the efficiency of the operations also becomes lower.

Further, as explained in FIGS. 14A, 14B, 14C, when deleting, adding, and moving a new component, an image of the original component is lost after deleting the component, a new component can not be added on a position where there is no land or a position where the previously provided component and the new one are overlapped, and further, the lands are disappeared from the original position after moving the component.

Furthermore, as explained regarding FIGS. 15A, B, a jumper-wiring is automatically generated in a section disconnected by a mistake. However, this is a remodeling procedure for a section not to be modified. Therefore, there is no operational procedure except a manually editing procedure after automatically remodeling. This makes the efficiency of remodeling operations be lower.

SUMMARY OF THE INVENTION

Accordingly, it is an object of the present invention to solve a problem on the conventional method and system for remodeling, designing and editing a printed wiring board.

It is another object of the present invention to provide remodeling, designing and editing method and system for a printed wiring board, by which steps for remodeling operations can be reduced, a quality of remodeled data can be improved, and remodeled data can be created by imaging a newly remodeled circuit according to a real remodeling procedure by increasing an efficiency of manual editing operations.

To attain the above-described objects, A remodeling, designing and editing method and system for a printed wiring board is provided, the method and system comprises the steps of: comparing connection pattern data of a previously provided printed wiring board with that of the latest circuit; displaying an editable section, which is different from that of the latest circuit, detected on the comparison, and inputting an instruction of disconnection or jumper-wiring of the editable section displayed on the displaying step.

In a detailed mode of the present invention, to attain objects of the present invention, a remodeling, designing and editing method and system for a printed circuit board is provided, the method and system comprising the steps of comparing connection pattern data of a previously provided printed wiring board with that of the latest circuit, making the pattern, which is different from that of the latest circuit, detected on the comparison, as an error to list a number of the errors in each error items, listing all nets including the errors selected from the listed error items, displaying the error with respect to a connection pattern corresponding to one net selected from the listed nets to display an editable section, and inputting an instruction for disconnection or wiring to the editable section displayed on the displaying step.

Additionally, the editable section displayed on the displaying step includes information of all layers of the multi-layered printed wiring board.

In another mode of the present invention, the listed error items are selected in order of errors named short error, shortage of connections and exclusive connections.

Further, to attain the objects of the present invention, in a remodeling, designing and editing method and system, land data showing a position for providing the previously provided printed wiring board and land data showing the latest components provided newly are included, the latest component is instructed to provide on a position indicated by the land data showing the position for providing the component of the previously provided printed wiring board; and the land data of the latest component is made to be equal to that of the previously provided printed wiring board.

Furthermore, the position of the component provided on the previously provided printed wiring board is instructed to move, the land data on the position of the component provided on the previously provided printed wiring board is kept as it is, and the land data of the position for providing the component instructed to move is used as a peculiar land data of the component instructed to move.

Further, other subjects and features of the present invention become clear by the description for explaining embodiments according to the attached drawings.

BRIEF DESCRIPTION OF THE DRAWINGS

FIG. 4 is an explanatory diagram of connecting and editing on an ECL (high-speed circuit) group according to the present invention.

FIGS. 8A to 8H are operational flow charts for explaining a detailed example for connection and edition according to the present invention.

DESCRIPTION OF THE PREFERRED EMBODIMENTS

Figure 1:
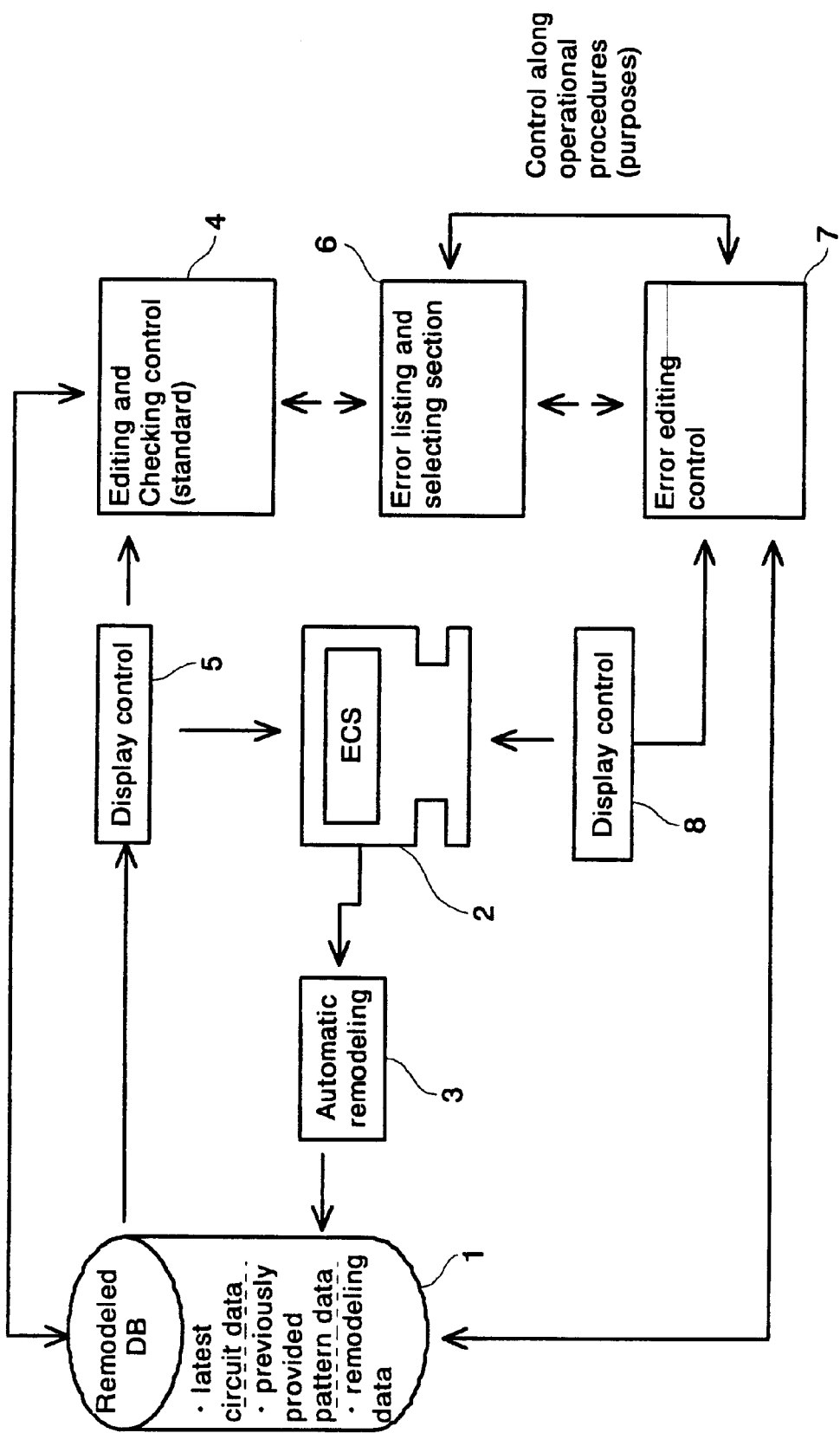
FIG. 1 is a structural block diagram of a system according to a method for remodeling and editing a printed wiring board of the present invention.

Embodiments according to the present invention will be now explained in accompanying with the attached drawings. Throughout the following descriptions, the same reference numerals and symbols are used to denote and identify corresponding or identical components.

FIG. 1 is a structural block diagram of a system according to a remodeling, designing and editing method for a printed wiring board of the present invention.

Figure 10:
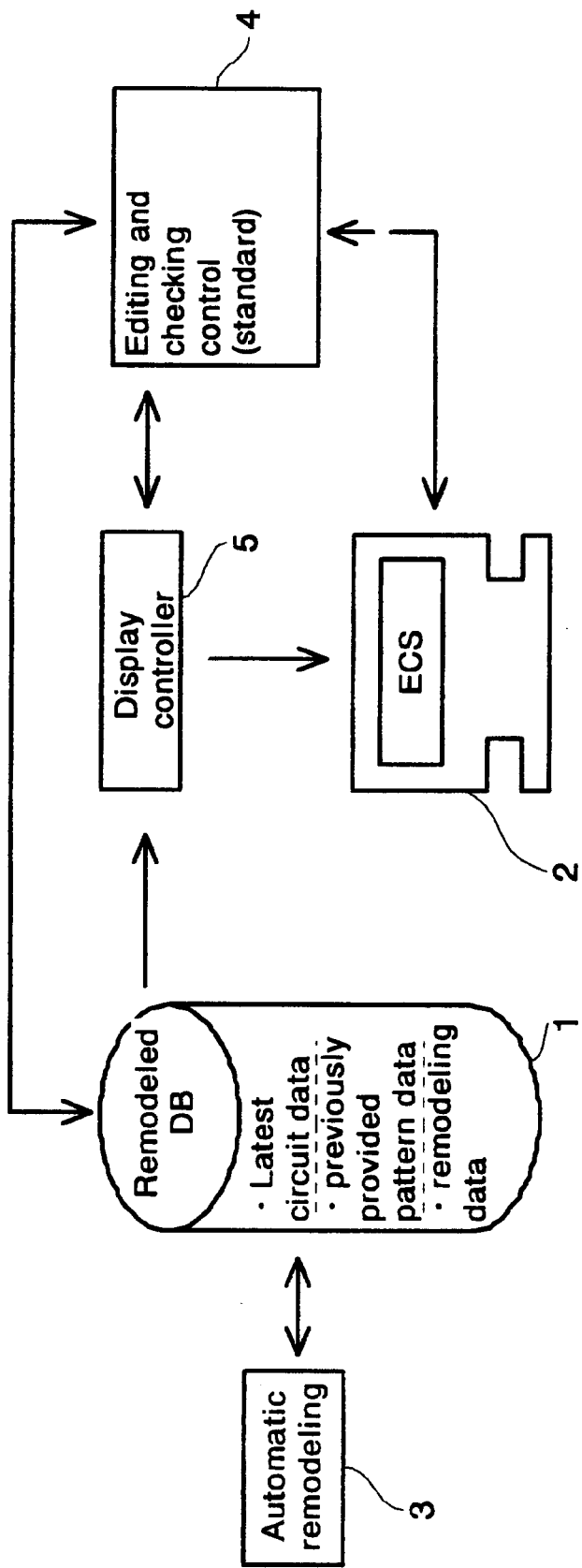
FIG. 10 shows one example of the conventional modeling, designing and editing method and system for a printed wiring board.
Figure 11:
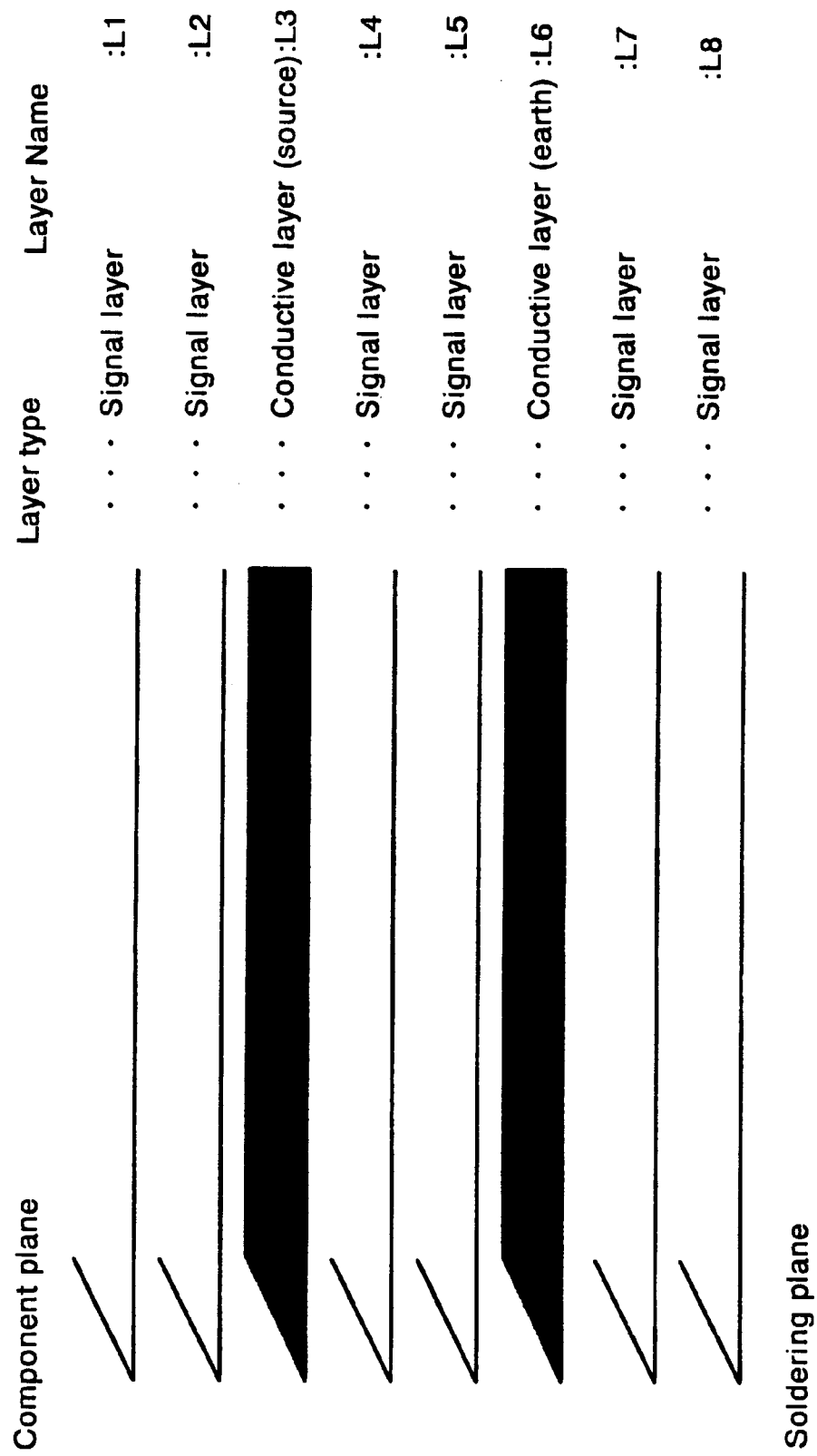
FIG. 11 is a structural example of layers on a multi-layered printed wiring board.
Figure 12:
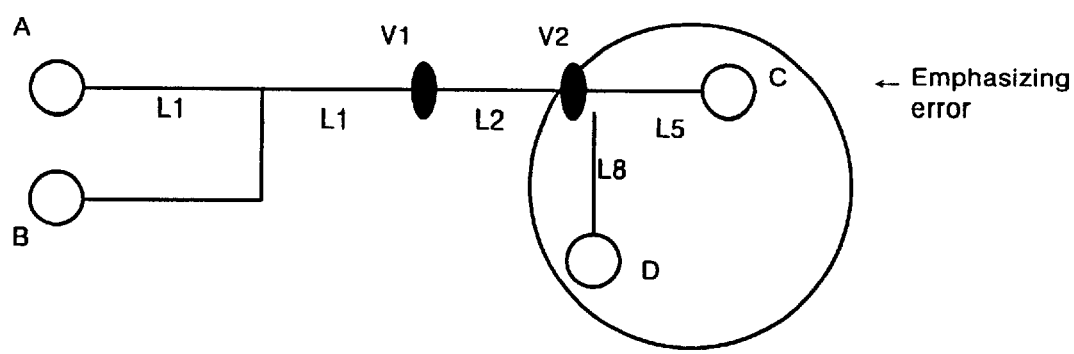
FIG. 12 is an example of a previously designed circuit pattern.
Figure 13:
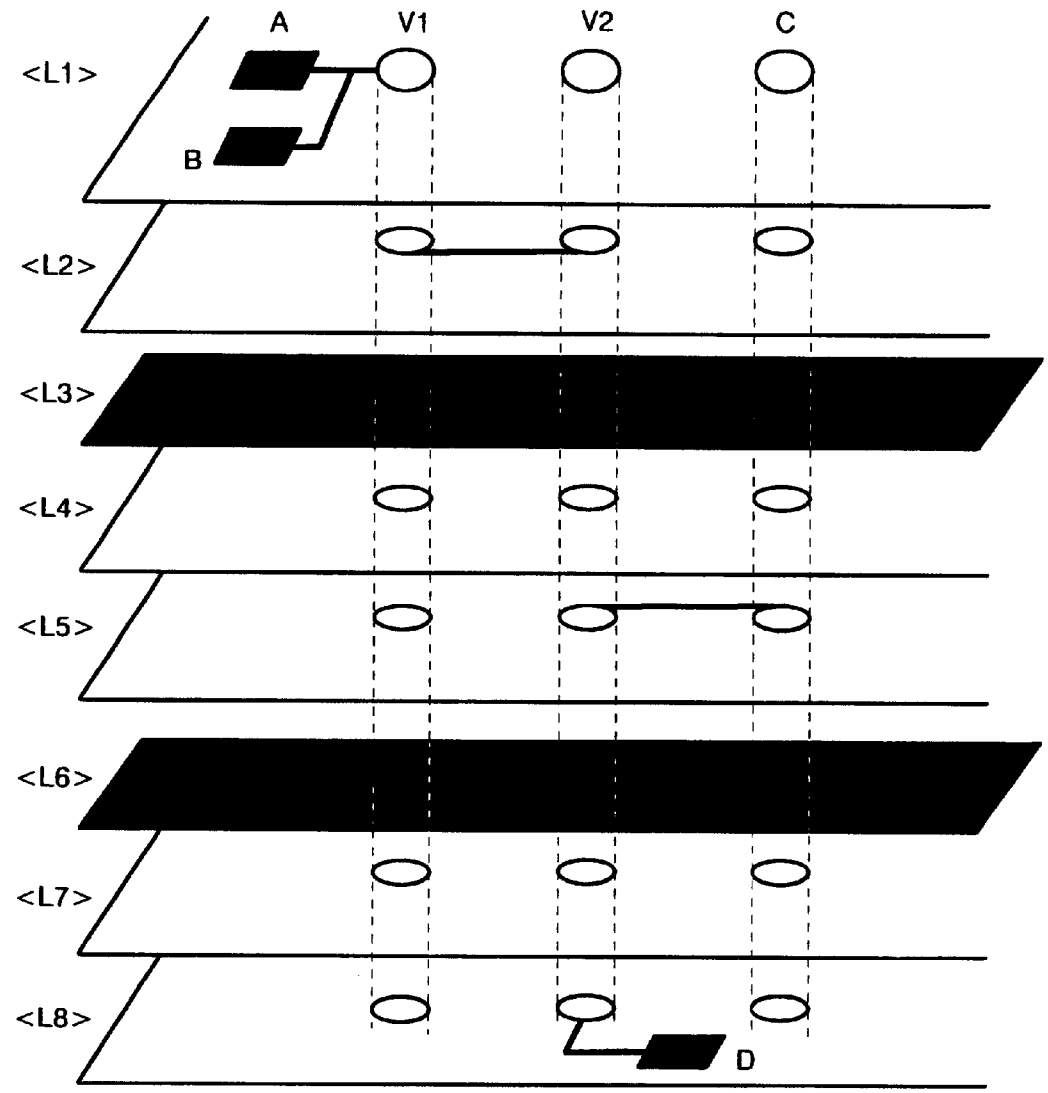
FIG. 13 illustrates a connection packaging structure of a printed wiring board corresponding to the circuit pattern of FIG. 12.
Figure 14A:
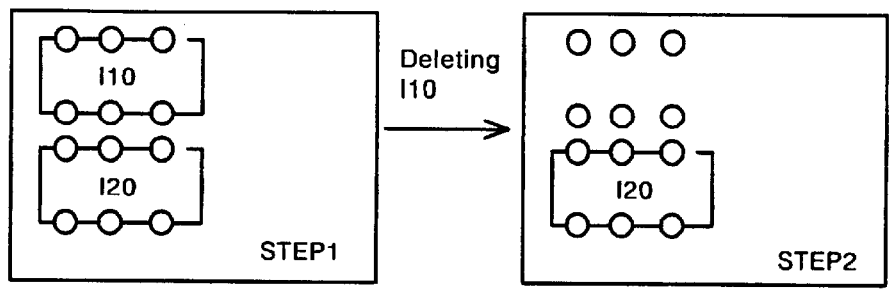
FIGS. 14A, 14B and 14C are explanatory diagrams for editing when remodeling a circuit pattern by adding, deleting or moving components in the system of FIG. 10.
Figure 14B:
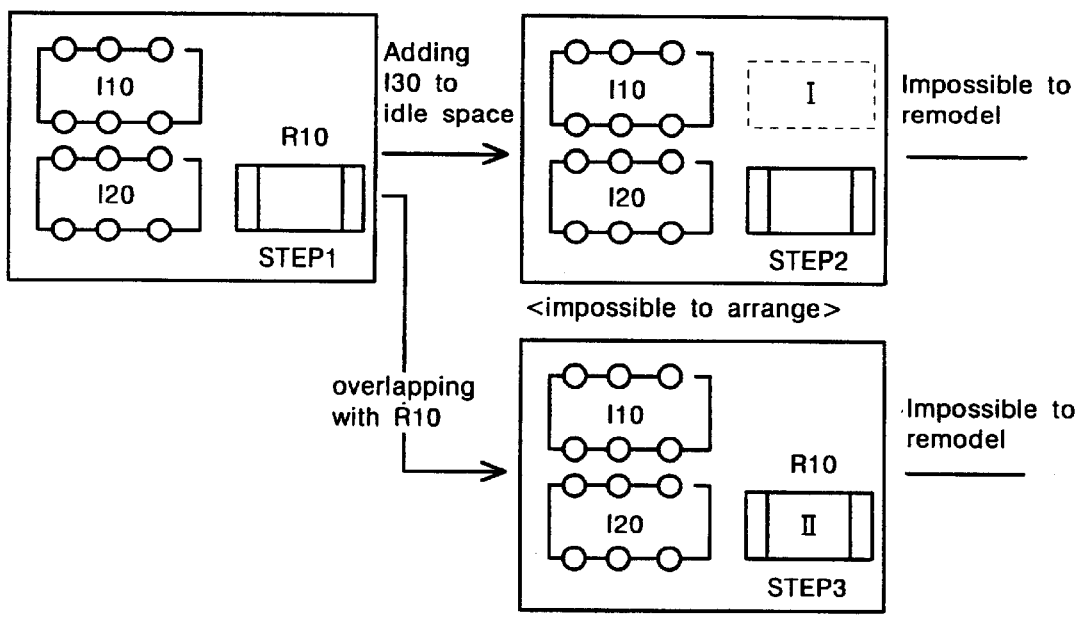
Figure 14C:
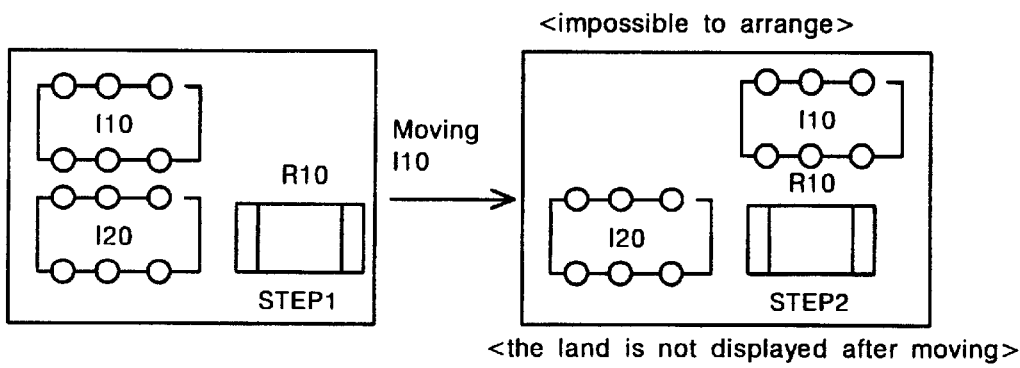
Figure 15A:
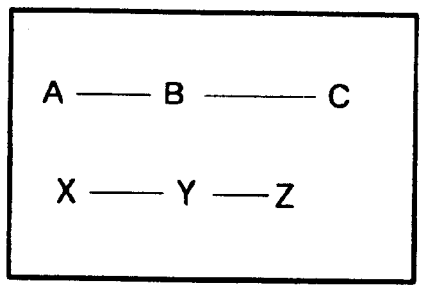
FIGS. 15A and 15B are diagrams for explaining a problem that automatic wiring is indistinguishable from manual remodeling on the system of FIG. 10.
Figure 15B:
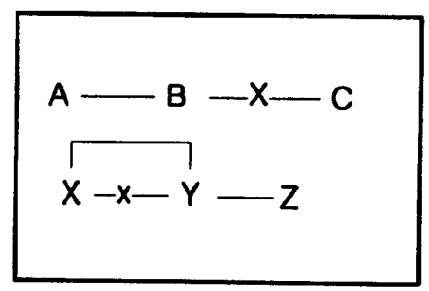

In the present invention, an editor 2 for remodeling, designing and editing a printed wiring board includes an error listing and selecting section 6, a control function 7 for editing errors and a second display controlling function 8 in comparison with the conventional structure of FIG. 10. Other elements are the same as those of FIG. 10.

Figure 2:
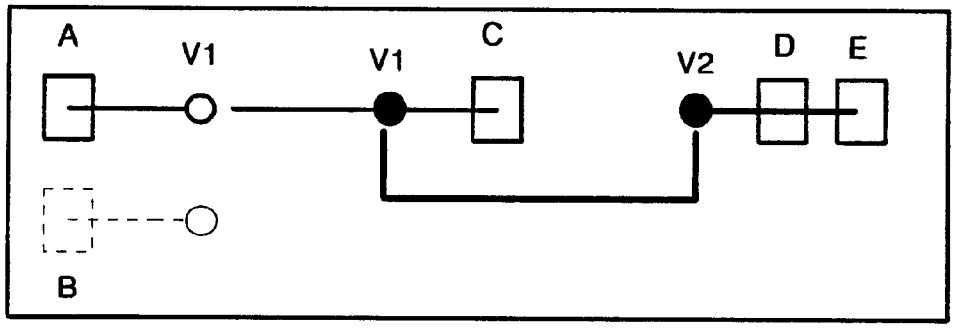
FIG. 2 is an explanatory diagram of a basic operational procedure of a remodeling, designing, and editing method for a printed wiring board of the present invention executed in the system structure of FIG. 1.

FIG. 2 is an explanatory diagram of a basic operational procedure in a remodeling, designing and editing for a printed wiring board of the present invention executed on the system structure of FIG. 1. At first, the editor 2 activates an editing and checking controller 4 to compare data of a previously provided pattern data with data of the latest circuit. A first display controller 5 displays the compared result on a panel for listing error items illustrated in FIG. 2 (STEP S1).

A number of errors is listed in each type on the panel for listing error items. For example, the first line indicates twenty of connection errors caused by an error type A: shorted.

If there are three error types: error type A means a pattern is shorted; error type B means connections are lacked; and error type C means connections are exclusive, errors are restored in order of types A, B and C to process according to operations. Therefore, a designer selects the first line at first. Then, the error listing and selecting section 6 edits and displays a list of all nets including a short error of the error type A (STEP S2).

Additionally, the designer selects a line of which net number is 1 to be edited from the list of all nets including short errors of the error type A, for example. Then, the controller 7 for editing errors edits the error status and the second display controller 8 displays a diagram for illustrating an error status of the connection on the editor 2 (STEP S3).

In here, a diagram for illustrating the error status of the connection displayed according to the present invention shows a connection pattern corresponding to the net number. Since an short error of the error type A is selected from the panel for listing error items displayed on the step S1, in the example of FIG. 2, the error type B, i.e., a section where connections are lacked, is not displayed in the diagram for illustrating the error status displayed on the step S3 of FIG. 2.

Additionally, in the diagram for illustrating the error status displayed by the present invention, a status of the nets including the selected type of errors is structured so as to be targeted to all layers of a printed circuit board. Therefore, a specified layer is not targeted to be edited, but all layers displayed as the diagram illustrating the error status can be edited.

Accordingly, on the display of the step S3 of FIG. 2, a section A is enlarged and displayed at first. When the error is removed from the section A, sections B and C are displayed in order to remove the errors. Thereby, the errors can be effectively removed according to an operational procedure.

In a comparison with the conventional method, the designer is entrusted with sections to be disconnected and points to be jumper-wired on editing connections in the conventional method. Therefore, many steps are required to input data excessively and input data suitably. This is not effective for editing the circuit.

Figure 3:
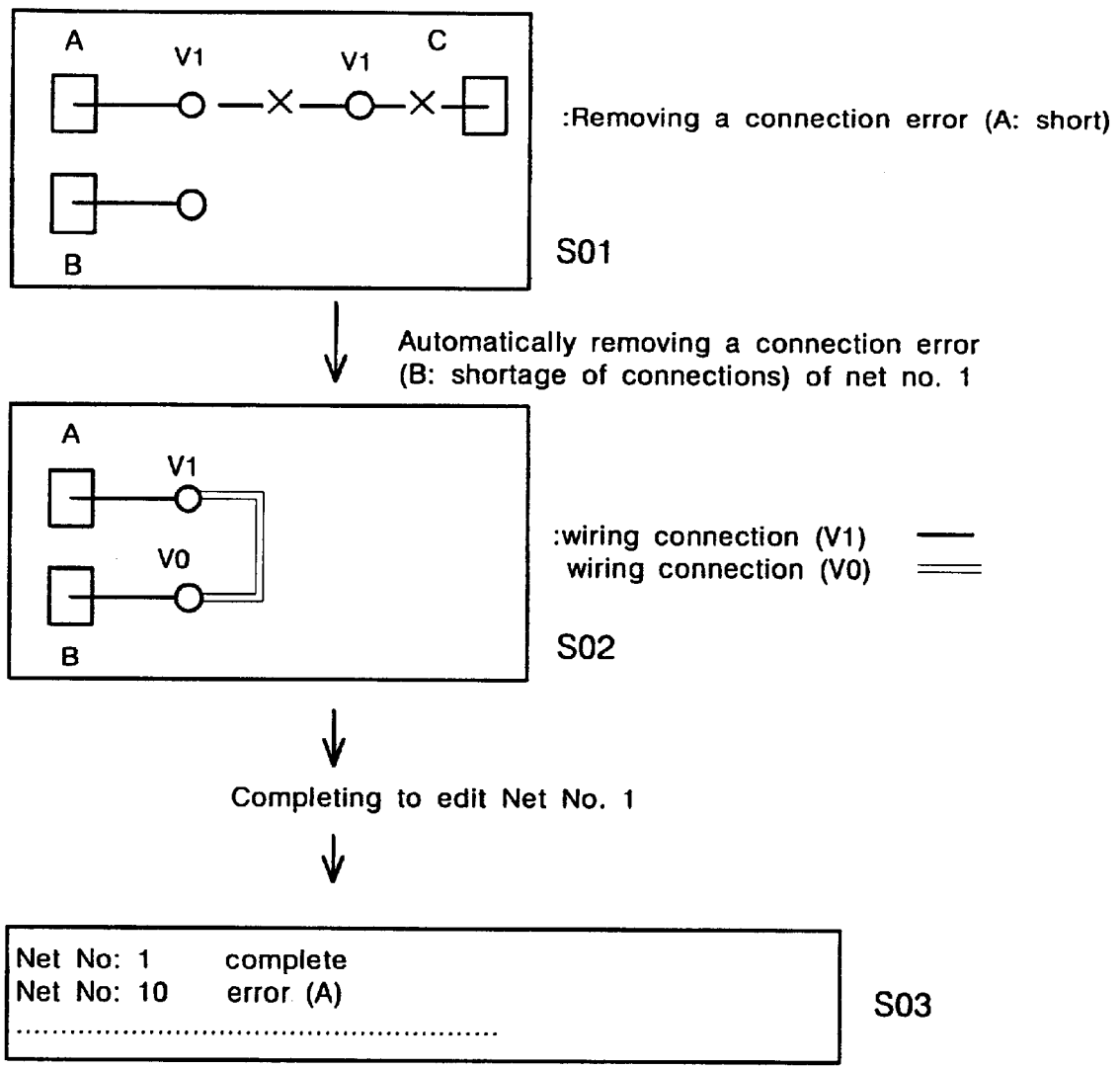
FIG. 3 is an explanatory diagram of disconnecting and editing procedures according to the present invention.

To solve these problems, in the present invention, as shown in FIG. 3, disconnectable sections can be displayed on editing for disconnection (STEP S01), connectable lands can be displayed in a priority order on jumper-wiring connection (STEP S02), and proper places for inputting data can be guided. Thereby, it is possible to effectively input the data (STEP S03). Further, as shown in the STEP S01, the error type B, i.e., connection error, can be also removed, automatically.

Additionally, a number of editable elements is limited for effective edition to automatically move to a display limited to elements to be edited of which connection relationship is considered. Thereby, it becomes possible to prevent from mistaking to input data and realize the efficiency of input operations.

It is also possible to apply the present invention with respect to connections in an ECL (high speed circuit) group. In FIG. 4, an editing and checking controller 4 compares the previously provided pattern data with the latest circuit data to display an ELC error a line of 7 on a display panel for listing ECL errors (STEP S11). On the display panel of the step S11, it is displayed on the display panel of the step S11 that a number of ELC error is 1.

Therefore, when a designer selects a line of 7 to edit with respect to connections in the ELC (high-speed circuit)

group, a list of ELC net numbers is displayed (STEP S12). In this example, each ECL net has limitations on connection order, branching length and antenna length. Therefore, when the designer selects the net including an error, which is classified and displayed by each symbols, i.e., ECL1 means connection error, ECL2 means branching length error and ECL3 means antenna length error, on the error-listing panel, modifications of ECL1, ECL2 and ECL3 are automatically displayed for guide.

In FIG. 4, when a net number 1 including the ECL2, i.e., branching length error, is selected, an error editing controller 7 displays the branching error (STEP S13). Therefore, the designer instructs to disconnect between V2 and B (STEP S14). The error is altered to connection order error by disconnecting between V2 and B, and therefore, a new error is displayed between V1 and V2 (STEP S15).

Thereby, the designer instructs to disconnect between V1 and V2 (STEP S16) and to jumper-wire between V1 and B (STEP S17). Additionally, the designer instructs to jumper-wire between V2 and V3 (STEP S18). Thereby, the editing process is completed here (STEP S19).

Figure 5:
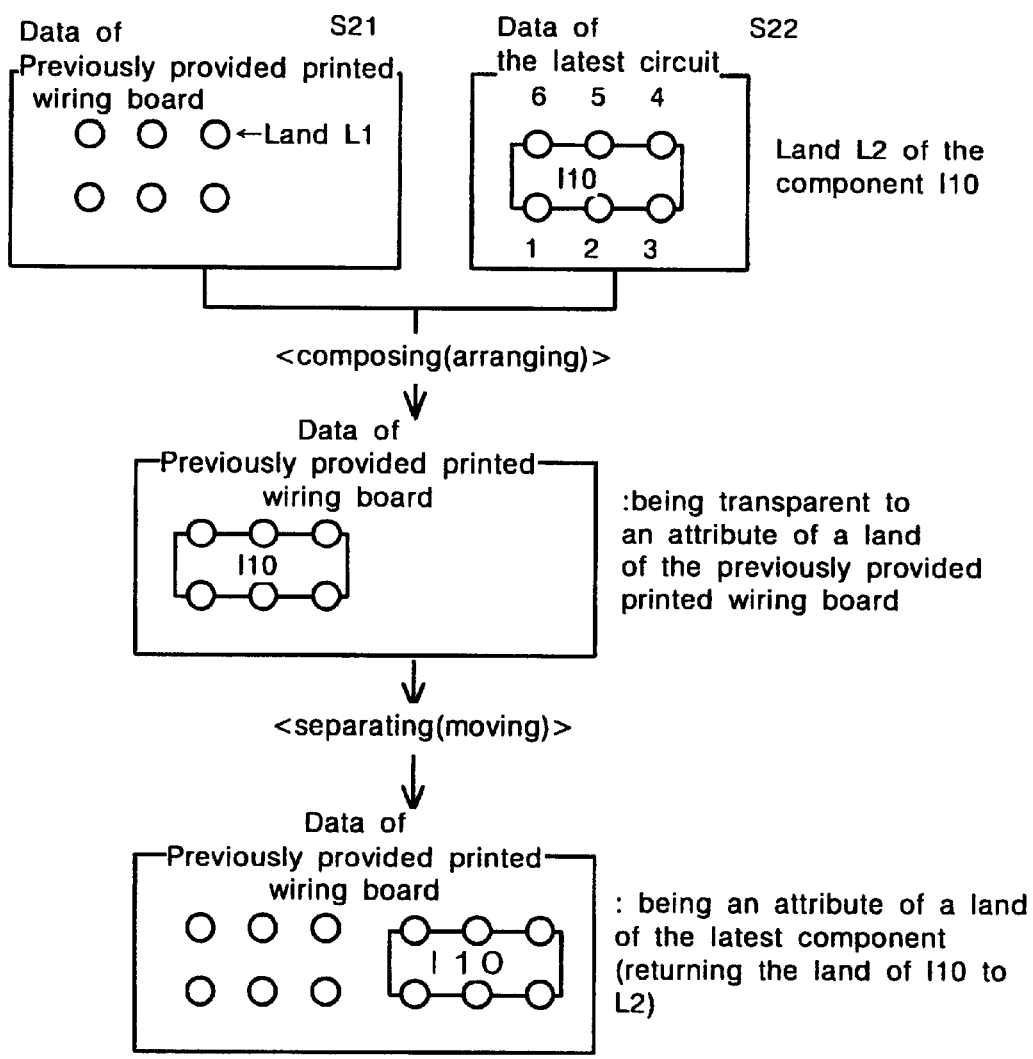
FIG. 5 explains a method for editing to provide a standard component according to the present invention.

FIG. 5 shows a method for editing a provision of standard components according to the present invention. Information of a land L1 is provided as data of the previously designed printed wiring board (STEP S21). On the contrary, information of a land L2 of a component I10 is provided as the latest component data (STEP S22).

When the designer instructs to arrange the component I10 on a position of the land L1, a land L2 of the component I10 is transparent to an attribute of the land L1 of the previously provided printed wiring board and becomes the land L1 (STEP S23). Further, when the component I10 is separated and moved from the land L1, the land of the component I10 is returned to the original land L2 of the latest component.

Figure 6:
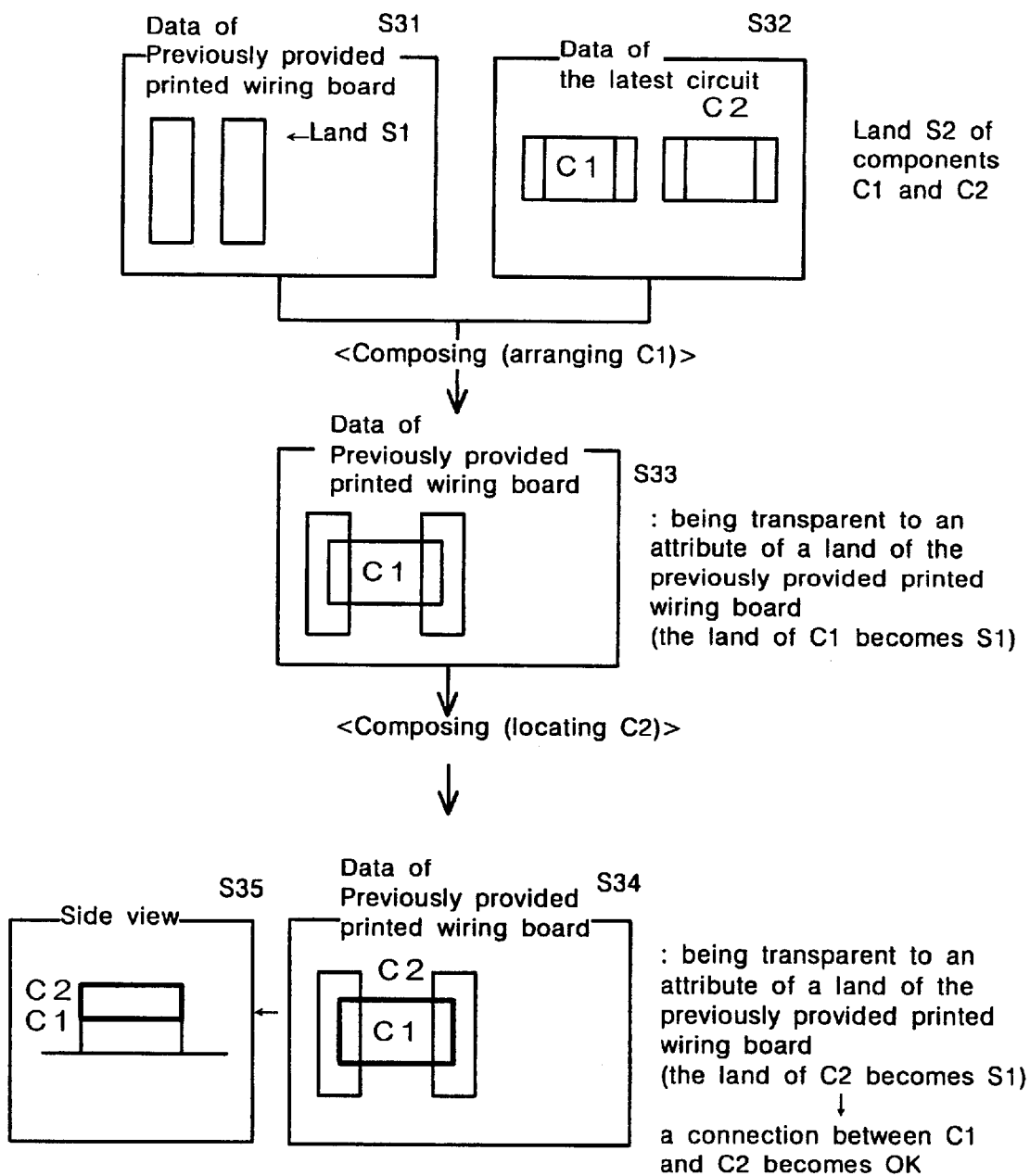
FIG. 6 explains a method for providing components, which are overlapped in one land according to the present invention.

FIG. 6 is a diagram for explaining a method for providing by overlapping components according to the present invention. A land S1 is provided as data of the previously provided printed wiring board (STEP S31). On the other hand, land S2 is provided as data of the latest components C1 and C2 (STEP S32).

When the latest component C1 is located on the position of the land S1, the land of the latest component C1 is transparent to an attribute of the land S1 (STEP S33). That is, the land of the latest component C1 becomes the land S1.

Additionally, the component C2 is overlapped and positioned on the same land S1. Then, the component C2 also becomes an attribute of the land S1 of the previously provided printed wiring board (STEP S34). As a result, it becomes possible to connect the latest components C1 and C2, and therefore, these components C1 and C2 are overlapped and located on the land S1 (STEP S35).

Figure 7:
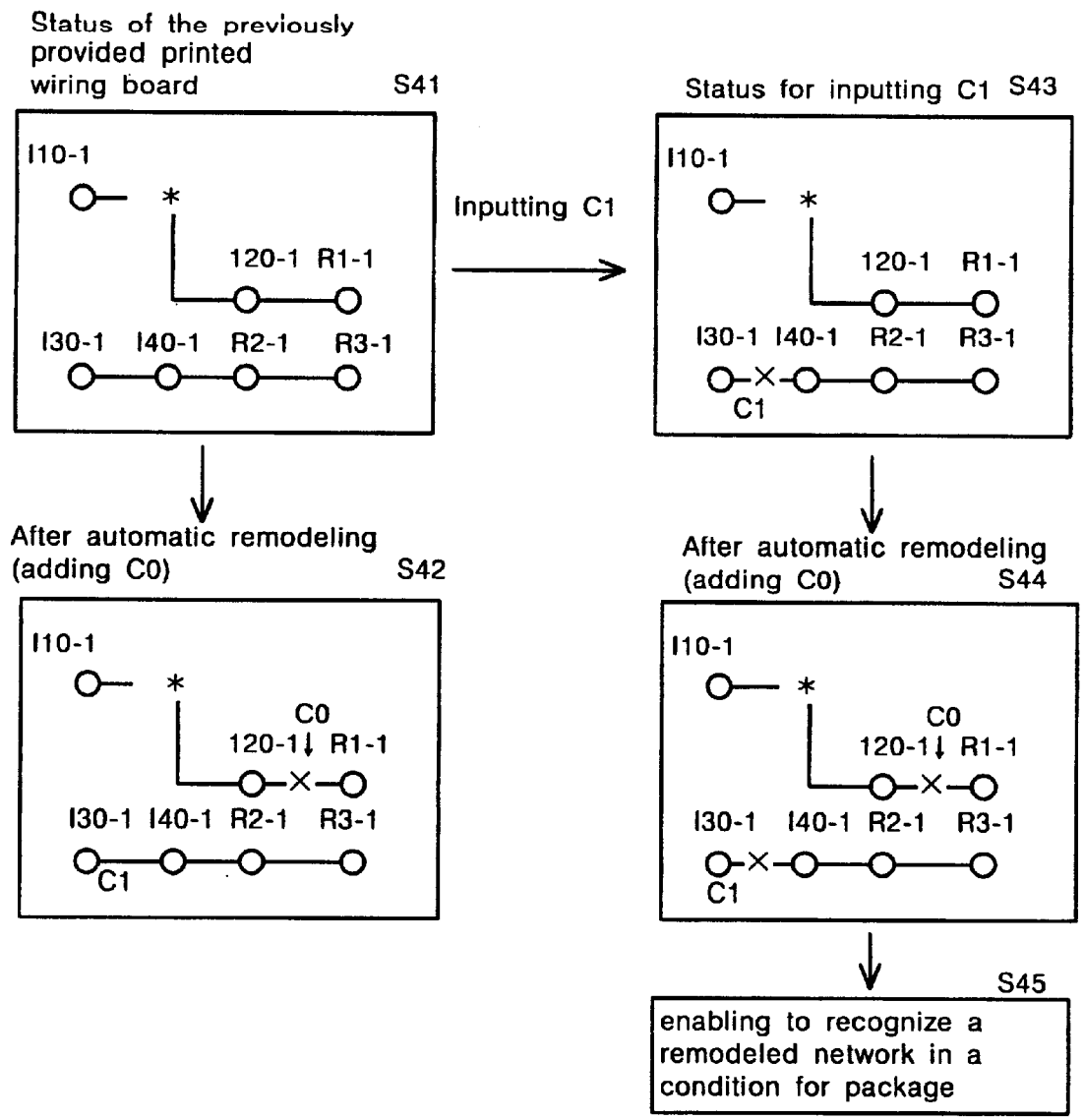
FIG. 7 explains a method for solving a problem that an automatic remodeling is indistinguishable from a circuit modification according to the present invention.

FIG. 7 shows a method according to the present invention to solve a problem that automatic wiring of a section disconnected by mistake is indistinguishable from alternation of a modified section of the circuit.

In this example, connections patterns I10-1, I20-1 and R1-1 and I30-1, I40-1, R2-1 and R3-1 are provided on the previously provided printed wiring board (STEP S41).

On the other hand, connection patterns I10-1 and I20-1 and I30-1, I40-1, R2-1 and R3-1 are provided on the latest circuit.

When considering a difference between the previously provided board and the latest circuit, it is understand that R1-1 should be deleted. In the method according to the present invention, an automatic remodeling process is executed only for the difference. In other words, a disconnection (C0) between I120-1 and R1-1 is performed (STEP S42).

On the other hand, when the designer instructs to disconnect between I30-1 and I40-1 by mistake (STEP S43), an automatic remodeling process is executed only for the difference. In other words, a disconnection (C0) between I120-1 and R1-1 is executed (STEP S44). Automatic wiring of the sections disconnected by mistake is not performed, and only a process for warning to the designer is performed. Therefore, the designer can recognize that it is a net remodeled following the condition of packaging (STEP S45).

A detailed embodiment according to the above-described features of the present invention will be now explained. FIGS. 8A to 8H are operational flow charts of a detailed example for connecting and editing patterns of the present invention.

In this example, connection patterns I10-1, I20-1, I30-1 and I40-1 and R1-and R2-1 are provided on the previously provided printed wiring board.

Connection patterns I10-1 and I40-1 (net number 1), I20-1, R1-1 and R2-1 (net number 2) and I30-1 and R1-3 (net number 3) are provided on the latest circuit.

This status on the printed wiring board having eight layers is as shown in FIG. 8A. In here, the editing and checking controller 4 edits a difference between the latest connection pattern and the previously provided one, and the number of errors in every error items and a detail in every nets are listed and displayed (FIG. 8B).

Next, when a designer selects a net number 1 from the list by the error listing and selecting function 6, the error editing controller 7 displays sections, in which short errors of the error type A occur, as shown FIG. 8C. In here, as explained above, this indication is reflected from the first to eighth layers, and only an editable section is displayed.

Accordingly, the designer can input an instruction for disconnecting three connections as shown in FIG. 8D. The error-editing controller 7 detects that the three connections are disconnected by inputting the instruction from the designer and displays the shortage of connections by an arrow B, as shown in FIG. 8E. The designer instructs to connect wires between the component pins I10-1 and I140-1 as shown in FIG. 8F. Thereby, it is completed to edit with respect to the net number 1.

Then, the designer selects an net number 2 from the list of FIG. 8B for editing the net number 2. Thereby, the error-editing controller 7 displays the shortage of connection on the net 2 by an arrow B, as shown in FIG. 8G. Therefore, the designer instructs to connect wires between I20-1 and R2-1 as shown in FIG. 8H.

The same edition is executed to a net number 3 or later till there is no error.

FIGS. 9A to 9D show a method for returning the contents for edition step by step on the above-described example.

Figure 9A:
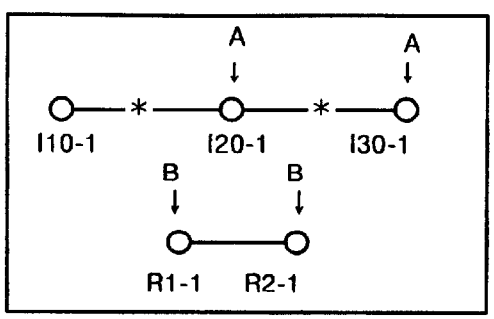
FIGS. 9A to 9D explain function for restoring editing operations on the detailed example for connection and edition according to the present invention.
Figure 9B:
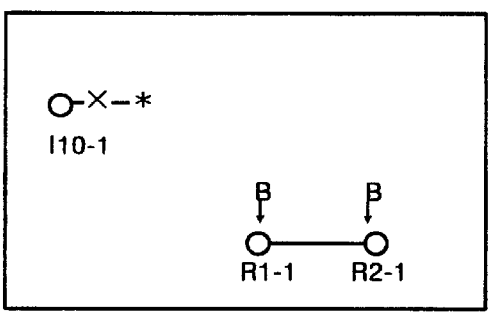

When a connection pattern of the latest circuit is I10-1, R1-1, R2-2, the designer instructs to disconnect between I10-1 and I20-1 on a connection pattern of the previously provided circuit in a phase 1 of FIG. 9A. Then, the phase 1 is moved to a phase 2 of FIG. 9B.

As R1-1 is not connected to R2-1 on this indication, the designer instructs to wire between I10-1 and R-1. Therefore, the phase 2 is moved to a phase 3 of FIG. 9C. There is no error on the phase 3, i.e., a status for edit completion. In here, a case where the wiring is as it is and the phase 1 is executed again will be now considered.

Figure 9C:
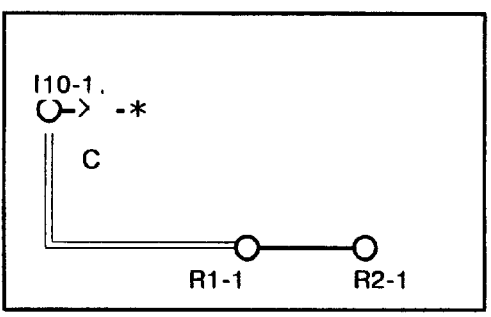
Figure 9D:
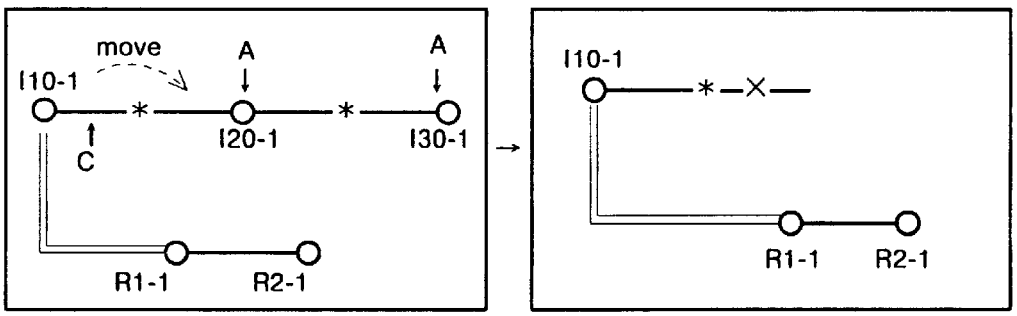

The designer selects a disconnection shown by an arrow C and moves it by a mouse in FIG. 9C. Then, the disconnection can be moved as shown in a phase 4 of FIG. 9D. Thereby, it is possible to finish editing the connection between I10-1 and I20-1 in a status of the phase 1 of FIG. 9A.

As explained according to the attached drawings, according to the present invention, it becomes possible to provide a method and system for remodeling, designing, and editing a printed wiring board in order to enable creating remodeling data imaging to remodel along a real operational procedure by reducing steps for remodeling operations, improving a quality of the remodeled data, or editing along operational procedures according to effectiveness of manual editing.

The present invention may be embodied in other specific forms without departing from the spirit or essential characteristics thereof. The present embodiment is therefore to be considered in all respects as illustrative and not restrictive, the scope of the invention being indicated by the appended claims rather than by the foregoing description and all changes which come within the meaning and range of equivalency of the claims are therefore intended to be embraced therein.

What is claimed is:

1. An editing system for use in remodeling a multi-layered printed circuit board comprising:
    a database storing connection pattern data of an existing printed circuit board and connection pattern data for a new circuit;
    a monitor displaying connection patterns of a circuit; and
    an editor for remodeling connection data of the existing printed circuit board, said editor having;
    means for comparing connection pattern data of an existing printed circuit board to be remodeled with that of a new circuit;
    means for displaying as errors an editable section, which is detected as having different pattern data from that of the new circuit based on the comparison; and
    means for inputting an instruction of disconnection or jumper-wiring in the editable section displayed on the monitor,
    wherein the displayed errors are selected by said inputting means in an order of errors named short error, shortage of connections, and exclusive connections.

2. An editing method for remodeling a multi-layered printed circuit board, comprising the steps of:
    comparing connection pattern data of an existing printed circuit board to be remodeled with pattern data of a new circuit;
    displaying an editable section, which is detected as having different pattern data from that of the new circuit based on the comparison; and
    inputting an instruction of disconnection or jumper-wiring in the editable section displayed by the displaying step, said instruction being based on said different pattern data.

3. The method according to claim 2,
    wherein the editable section displayed by the displaying step includes information of all layers of the multi-layered printed circuit board.

4. The method according to claim 2, further comprising the steps of:
    maintaining data input by the step of inputting an instruction of disconnection or jumper-wiring; and
    setting preference for the instruction of jumper-wiring rather than disconnection in an optional situation.

5. An editing method for remodeling a multi-layered printed circuit board, comprising the steps of:
    comparing connection pattern data of an existing printed circuit board to be remodeled with pattern data of a new circuit to identify patterns, which are detected as errors as having different pattern data from those of the new circuit based on the comparison;
    listing a number of errors identified for each of plural error items;
    listing connection nets, each including errors corresponding to the number present in each error item selected from the plural error items;
    displaying errors included in a connection net selected from the listed connection nets in an editable section; and
    inputting an instruction of disconnection or jumper-wiring in the editable section.

6. The method according to claim 5,
    wherein the editable section displayed by the displaying step includes information of all layers of the multi-layered printed circuit board.

7. The method according to claim 5, further comprising the step;
    after the step of displaying errors, selecting the listed errors in order of errors named short error, shortage of connections, and excessive connections.

8. An editing method for remodeling a printed circuit board, comprising the steps of:
    supplying first land data indicating positions where components are provided on an existing printed circuit board and second land data indicating new components to be newly provided; and
    instructing to provide the new components on the positions of the existing printed circuit board, which are indicated by the first land data so that the second land data replaces the first land data.

9. The method according to claim 8, further comprising the steps of:
    instructing that positions of components provided on the existing printed circuit board be shifted; and
    providing land data indicating the positions of the components shifted as third land data for only the components shifted, while the first land data is maintained.

10. An editing system for use in remodeling a multi-layered printed circuit board comprising:
    a database storing connection pattern data of an existing printed circuit board and connection pattern data for a new circuit;
    a monitor displaying connection patterns of a circuit; and
    an editor for remodeling connection data of the existing printed circuit board, said editor having;
    means for comparing connection pattern data of an existing printed circuit board to be remodeled with that of a new circuit;
    means for displaying as errors an editable section, which is detected as having different pattern data from that of the new circuit based on the comparison; and
    means for inputting an instruction of disconnection or jumper-wiring in the editable section displayed on the monitor.

11. The system according to claim 10, wherein the editable section includes information of all layers of the multi-layered printed circuit board.

* * * * *